(12) United States Patent
Danieli et al.

(10) Patent No.: US 10,297,385 B2
(45) Date of Patent: May 21, 2019

(54) METHOD FOR A TARGETED SHAPING OF THE MAGNETIC FIELD OF PERMANENT MAGNETS

(71) Applicant: Rheinisch-Westfälische Technische Hochschule (RWTH) Aachen, Aachen (DE)

(72) Inventors: Ernesto Pablo Danieli, Aachen (DE); Bernhard Blumich, Roetgen-Rott (DE); Wasif Zia, Aachen (DE); Holger Leonards, Aachen (DE)

(73) Assignee: Rheinisch-Westfällsche Technische Hochschule (RWTH) Aachen, Aachen (DE)

( * ) Notice: Subject to any disclaimer, the term of this patent is extended or adjusted under 35 U.S.C. 154(b) by 475 days.

(21) Appl. No.: 15/026,035

(22) PCT Filed: Sep. 30, 2013

(86) PCT No.: PCT/EP2013/070382
§ 371 (c)(1),
(2) Date: Mar. 30, 2016

(87) PCT Pub. No.: WO2015/043684
PCT Pub. Date: Apr. 2, 2015

(65) Prior Publication Data
US 2016/0225523 A1    Aug. 4, 2016

(51) Int. Cl.
| | | |
|---|---|---|
| *H01F 41/02* | (2006.01) | |
| *G01R 33/383* | (2006.01) | |
| *G01R 33/3873* | (2006.01) | |
| *B23K 26/38* | (2014.01) | |
| *B23K 26/40* | (2014.01) | |
| *B23K 26/142* | (2014.01) | |

(52) U.S. Cl.
CPC ....... *H01F 41/0286* (2013.01); *B23K 26/142* (2015.10); *B23K 26/38* (2013.01); *B23K 26/40* (2013.01); *G01R 33/383* (2013.01); *G01R 33/3873* (2013.01); *H01F 41/0253* (2013.01)

(58) Field of Classification Search
CPC ...... B23K 26/142; B23K 26/38; B23K 26/40; H01F 41/02; G01R 33/383
USPC ............... 219/121.68, 121.69, 121.8, 121.85
See application file for complete search history.

(56) References Cited

U.S. PATENT DOCUMENTS

| | | | |
|---|---|---|---|
| 4,943,774 A | | 7/1990 | Breneman et al. |
| 6,087,827 A | * | 7/2000 | Oudet .................... G01R 33/06 |
| | | | 219/121.68 |
| 6,515,382 B1 | * | 2/2003 | Ullakko .................. F16D 65/14 |
| | | | 310/26 |
| 2002/0140535 A1 | | 10/2002 | Neuberth |

FOREIGN PATENT DOCUMENTS

EP    1 167 989 A2    1/2002

OTHER PUBLICATIONS

International Search Report for corresponding International Application No. PCT/EP2013/070382 dated Jul. 21, 2014.
Danieli et al., "Highly Stable and Finely Tuned Magnetic Fields Generated by Permanent Magnet Assemblies", Physical Review Letters, vol. 110, No. 18, Apr. 30, 2013, pp. 180801-1-180801-5.

* cited by examiner

*Primary Examiner* — Samuel M Heinrich
(74) *Attorney, Agent, or Firm* — Renner Otto Boisselle & Sklar, LLP

(57) ABSTRACT

The invention relates to a for a targeted shaping of the magnetic field of a single permanent magnet or an arrangement of a plurality of permanent magnets, wherein magnetic material from selected locations of the single permanent magnet or at least one of said permanent magnets of the arrangement is removed by means of at least one of the following removal procedures for shaping the magnetic field: laser ablation using laser radiation, high-pressure waterblasting using high-pressure water jets and mechanical ablation using a non-magnetic tool.

9 Claims, 1 Drawing Sheet

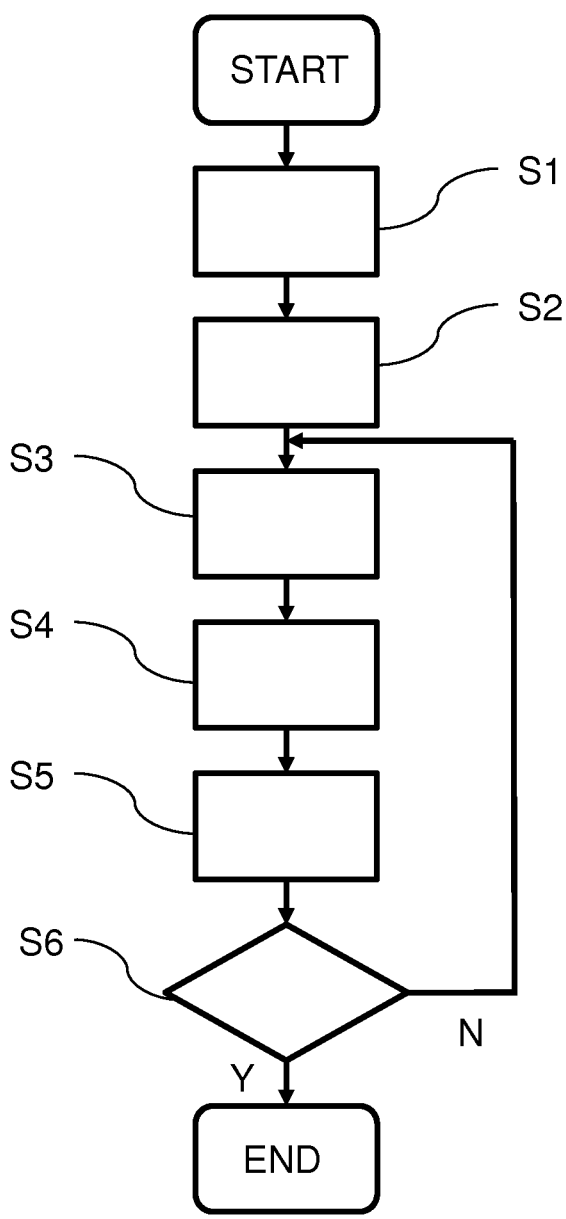

METHOD FOR A TARGETED SHAPING OF THE MAGNETIC FIELD OF PERMANENT MAGNETS

This application is a national phase of International Application No. PCT/EP2013/070382 filed Sep. 30, 2013 and published in the English language.

The invention relates to a method for a targeted shaping of the magnetic field of a single permanent magnet or an arrangement of a plurality of permanent magnets.

Magnetic fields generated by permanent magnets are used In many areas of science and engineering, Some examples are nuclear magnetic resonance (NMR) spectroscopy, magnetic resonance imaging (MRI), compact particle accelerators setups, laser-plasma accelerators, magnetic traps, and inertial guidance systems used in aerospace devices. After the assembly process, the spatial dependence of the magnetic field generated by arrays of permanent magnets typically deviate from the theoretical predictions.

Theoretically, the magnetic field is normally described by a set of orthogonal functions called spherical harmonics. Under this representation, an arbitrary field is mathematically expressed as the sum of many independent terms, each of them with particular space dependence. Magnetic field shimming or tuning consists on selecting from this expansion the terms that best describe a desired spatial field distribution, while cancelling the rest of the terms. This methodology is nowadays practically achieved by two main means:

1) Electrical currents circulating through properly designed shim coils which are assembled together with the magnet array. Typically, the shape of each coil reproduces the required current density suitable to eliminate one particular term. One coil is required for each term in the expansion. For NMR spectroscopy applications, more than 20 such coils are needed.

2) An alternative and more efficient approach to generate magnetic field correction is based on the movement of individual blocks forming the magnetic array. By this procedure, a combination of movements reproduces a desired spatial field dependence.

The main limitation of the electrical shim-coil approach is the low efficiency of the coils to generate magnetic fields. Depending on the application, the strength of the current required for generating field corrections may achieve hundreds of Amperes. An external power source is required to control the current delivery. Additionally, extra space in the magnet arrangement should be left to include the set of shim coils. All these issues limit the portability of the magnets and the size reduction for portable applications.

The shim approach based on individual magnet movement has demonstrated to be extremely useful. Its main drawbacks are that individual magnet pieces need to be positioned with micrometer accuracy and may change their position with time. Furthermore, the shim order is limited by the number of movable magnet pieces. Current technology can only go to $4^{th}$ order, while current driven shim coils can go to $5^{th}$ order and even higher.

Therefore, the object underlying the present invention is to provide a method for a targeted shaping of the magnetic field an arrangement which overcomes the aforementioned problems.

This object is achieved by the invention as defined by the independent claim. The dependent claims detail advantageous embodiments of the invention.

According to one aspect of the invention, magnetic material from selected locations of the single permanent magnet or at least one of the permanent magnets of the arrangement is removed by means of at least one of the following removal procedures for shaping the magnetic field:
  (i) laser ablation using laser radiation,
  (ii) high-pressure waterblasting using high-pressure water jets and
  (iii) mechanical ablation using a non-magnetic tool.

Preferably, the magnetic material from the selected locations of the single permanent magnet or at least one of said permanent magnets of the arrangement is removed by laser ablation using laser radiation for shaping the magnetic field. Laser ablation is the process of removing material from a solid surface by irradiating it with laser radiation (a laser beam). At low laser flux, the material is heated by the absorbed laser energy and evaporates or sublimates. At high laser flux, the material is typically converted to a plasma. Usually, laser ablation refers to removing material with a pulsed laser, but it is possible to ablate material with a continuous wave laser beam if the laser intensity is high enough. The technique of laser ablation allows correcting the spurious field contribution to achieve a desired field profile with very high accuracy.

The following advantages can be expected from the implementation of the proposed methodology:
  1.) Passive field correction.
  2.) No additional space in the arrangement is required which allows for more compact structures.
  3.) Allows automatic shimming procedures, which improve the production time of the magnet arrangement.
  4.) Miniaturization of the arrangement of permanent magnets (e.g. a magnetic array).
  5.) Cost reduction in the production of permanent magnets with critical field profiles as encountered in NMR spectroscopy and particle physics.
  6.) Allows high precision field correction, since in principle it is possible to generate any field order correction to the magnetic field, which by using other methods such as shim coils, or movable magnets, there is always an upper limit for the correction order. This limitation is imposed by the hardware design (finite number of coils or movable magnets).

According to a preferred embodiment of the present invention, the selected locations are determined by use of a model, especially a mathematical model, of the single permanent magnet or the arrangement of permanent magnets. Preferably, the mathematical model is based on the finite element method (FEM). FEM is a numerical technique for finding approximate solutions to boundary value problems for differential equations.

According to another preferred embodiment of the present invention, the method comprises the steps of:
  (a) detecting the field characteristics of the magnetic field of the current single permanent magnet or the current arrangement of permanent magnets,
  (b) determining the parameters of the model of the single magnet or the arrangement for generating a magnetic reference field with said detected field characteristics,
  (c) determining a needed material reduction of the single permanent magnet or the individual permanent magnets of the arrangement to adapt the magnetic field to a desired shape of said magnetic field by use of the model, and
  (d) removing the magnetic material from the selected locations of the permanent magnet or at least one of the permanent magnets of the arrangement to reduce the material accordingly.

In one embodiment, the needed material reduction of the individual permanent magnets (c) is determined by varying location parameters of the permanent magnets used in the model.

According to yet another preferred embodiment of the present invention, the method is an iterative method.

Preferably, the iterative method comprises the further steps of
(e) detecting the field characteristics of the shaped magnetic field of the current single permanent magnet or the current arrangement of permanent magnets again, and
(f) deciding whether the shaped magnetic field has the desired shape or whether to continue with steps (c)-(f).

According to yet another preferred embodiment of the present invention, the arrangement of a plurality of permanent magnets is a component for one or more of the following application devices and/or application systems:
nuclear magnetic resonance (NMR) spectroscopy system,
magnetic resonance imaging (MRI) system,
compact particle accelerators setups,
laser-plasma accelerators,
magnetic traps, and
inertial guidance systems, especially for use in aerospace devices.

According to yet another preferred embodiment of the present invention, the targeted shaping of the magnetic field by laser ablation is complemented by deactivating magnetic domains of the magnetic material by means of local heating of the magnetic material above the Curie temperature by use of the laser radiation.

The laser radiation is preferably targeted on the selected locations by use of a scanning laser device.

These and other aspects of the invention will be apparent from and elucidated with reference to the embodiments described hereinafter.

In the drawing:

FIG. 1 depicts a flowchart of a method for targeted shaping of the magnetic field of an arrangement according to a preferred embodiment of the invention.

It shows an iterative method for targeted shaping of the magnetic field of an arrangement of a plurality of permanent magnets with six steps.

The method comprises the following steps:

In a first step S1 a field characteristics of the magnetic field of the current arrangement is detected, in a second step S2 the parameters of a model of the arrangement are determined for generating a magnetic reference field with said detected field characteristics, in a third step S3 a needed material reduction of the individual permanent magnets is determined to adapt the magnetic field to a desired shape of the by use of the model, in a fourth step S4 the magnetic material from the selected locations of the at least one of the permanent magnets is removed by laser ablation to reduce the material accordingly, in a fifth step S5 the field characteristics of the shaped magnetic field of the current arrangement is detected again, and in a in a sixth step S6 it is decided whether the shaped magnetic field has the desired shape or whether to continue with steps three to six.

Of course this method can be used for a targeted shaping of the magnetic field of a single permanent magnet as well.

Permanent magnetic materials are the only magnetic source that can be used to generate magnetic fields without power consumption or maintenance. Moreover, due to their robustness and scalability such stand-alone magnets are very attractive for many scientific and engineering areas. However, due to a large dispersion in the average value of the remnant polarization between different identical pieces, the spatial distribution of the magnetic field generated by arrangements built from these materials present important deviations from the theoretical magnetic field profile. The present invention proposes a method for correcting or tuning the spatial dependence of the magnetic field generated by arrays of permanent magnets by heating and/or ablating with laser radiation volume portions of the individual magnetic pieces that form the array. Once the final form of the arrangement has been built and its field has been mapped by determining the field characteristics, obtaining the spurious magnetic field contributions or inhomogeneity terms, it is possible then to identify in each magnetic piece the portion of volume that has to be removed in order to match the theoretical field profile.

The size of the at least one permanent magnet is in the millimeter range or higher. The size of the locations to be removed can be as smalls one atom or higher. The permanent magnets may be made from different materials including super-conducting magnet materials.

In general, it is possible to substitute the laser ablation using laser radiation by the following other removal procedures:
high-pressure waterblasting using high-pressure water jets and
mechanical ablation using a non-magnetic tool.

While the invention has been illustrated and described in detail in the drawings and foregoing description, such illustration and description are to be considered illustrative or exemplary and not restrictive; the invention is not limited to the disclosed embodiments.

Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

The invention claimed is:

1. Method for a targeted shaping of the magnetic field of a single permanent magnet or an arrangement of a plurality of permanent magnets, wherein magnetic material from selected locations of the single permanent magnet or at least one of said permanent magnets of the arrangement is removed by means of at least one of the following removal procedures for shaping the magnetic field:
laser ablation using laser radiation,
high-pressure waterblasting using high-pressure water jets and
mechanical ablation using a non-magnetic tool, and
wherein the selected locations are determined by use of a model of the single permanent magnet or the arrangement of permanent magnets, and
wherein the method comprises:
detecting the field characteristics of the magnetic field of the current single permanent magnet or the current arrangement of permanent magnets (S1),
determining the parameters of the model of the single permanent magnet or the arrangement of permanent magnets for generating a magnetic reference field with said detected field characteristics (S2), determining a needed material reduction of the single permanent magnet or the individual permanent magnets of the arrangement to adapt the magnetic field to a desired shape of said magnetic field by use of the model (S3), and removing the magnetic material from the selected locations of the permanent magnet or at least one of the permanent magnets of the arrangement by to reduce the material accordingly (S4).

2. Method according to claim 1, wherein the method is an iterative method.

3. Method according to claim 2, wherein the method comprises the further steps of:

detecting the field characteristics of the shaped magnetic field of the current single permanent magnet or the current arrangement of permanent magnets again (S5), and as a decision step (S6), deciding whether the shaped magnetic field has the desired shape or whether to repeat steps (S1) to (S6).

4. Method according to claim 1, wherein the arrangement of a plurality of permanent magnets is a component for one or more of the following application devices and/or application systems:

nuclear magnetic resonance spectroscopy system, magnetic resonance imaging system, compact particle accelerators setups, laser-plasma accelerators, magnetic traps, and inertial guidance systems, especially for use in aerospace devices.

5. Method according to claim 1, wherein the targeted shaping of the magnetic field by laser ablation is complemented by deactivating magnetic domains of the magnetic material by means of local heating of the magnetic material above the Curie temperature by use of the laser radiation.

6. Method according to claim 1, wherein the laser radiation is targeted on the selected locations by use of a scanning laser device.

7. Method according to claim 1, wherein the model is a mathematical model.

8. Method according to claim 1, wherein the model is a mathematical model of the single permanent magnet or the arrangement of permanent magnets.

9. Method according to claim 8, wherein the mathematical model of the single permanent magnet or the arrangement of permanent magnets is based on the finite element method.

* * * * *

UNITED STATES PATENT AND TRADEMARK OFFICE
CERTIFICATE OF CORRECTION

PATENT NO. : 10,297,385 B2
APPLICATION NO. : 15/026035
DATED : May 21, 2019
INVENTOR(S) : Danieli et al.

Page 1 of 1

It is certified that error appears in the above-identified patent and that said Letters Patent is hereby corrected as shown below:

On the Title Page

Item (73), Assignee should be corrected to read:
Rheinisch-Westfälische Technische Hochschule (RWTH) Aachen, Aachen (DE).

Signed and Sealed this
Fourteenth Day of July, 2020

Andrei Iancu
*Director of the United States Patent and Trademark Office*